(12) United States Patent
Cox et al.

(10) Patent No.: US 6,405,339 B1
(45) Date of Patent: Jun. 11, 2002

(54) PARALLELIZED PROGRAMMABLE ENCODER/SYNDROME GENERATOR

(75) Inventors: Charles Edwin Cox, San Jose; Martin Aureliano Hassner, Mountain View, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/387,665

(22) Filed: Aug. 31, 1999

(51) Int. Cl.[7] .................................................. G06F 11/10
(52) U.S. Cl. ........................................ 714/756; 714/784
(58) Field of Search ................................ 714/756, 784, 714/757

(56) References Cited

U.S. PATENT DOCUMENTS

| | | | |
|---|---|---|---|
| 4,142,174 A | * | 2/1979 | Chen et al. |
| 4,413,339 A | | 11/1983 | Riggle et al. ................. 371/38 |
| 4,567,594 A | | 1/1986 | Deodhar ....................... 371/38 |
| 4,835,775 A | * | 5/1989 | Seroussi |
| 5,444,719 A | | 8/1995 | Cox et al. .................. 371/37.1 |
| 5,875,200 A | | 2/1999 | Glover et al. ............... 714/784 |

* cited by examiner

*Primary Examiner*—Phung M. Chung
(74) *Attorney, Agent, or Firm*—R. Bruce Brodie; Marc D. McSwain (57) ABSTRACT

A composite encoder/syndrome generating device that both computes check symbols over counterpart data symbol strings to form codewords, and derives syndromes from codewords indicative of their error state. The multistage device provides recursive processing paths at each stage of depth corresponding to the number of symbols concurrently applied to the device. The device is adapted as an encoder when the feed-forward paths between stages are enabled; it is adapted as a syndrome generator upon their disablement. The number of symbols concurrently processed may be varied from clock cycle to clock cycle by conforming the recursion paths per stage to the number of symbols applied as input to the device.

9 Claims, 5 Drawing Sheets

FIG. 1 (PRIOR ART) COMPOSITE REED-SOLOMON ENCODER/SYNDROME GENERATOR WITH VARIABLE ERROR CORRECTION POWER

PARALLELIZED PROGRAMMABLE ENCODER/SYNDROME GENERATOR

FIELD OF THE INVENTION

This invention relates to algebraic codes as exemplified by codes of the Reed-Solomon (n,k) type, and more particularly to enhancing the performance of composite encoders/syndrome generators computing check symbols over data symbol strings to form codewords in a write path and error syndromes from codewords in a readback path.

DESCRIPTION OF RELATED ART

The discussion of the prior art starts with a comment on separate error path processing. This is followed by a brief resume of the properties of error correction codes (ECC), including Reed-Solomon codes as examples. The themes are brought to a focus in discussion of Cox et al., U.S. Pat. No. 5,444,719, "Adjustable Error-Correction Composite Reed-Solomon Encoder/Syndrome Generator", issued Aug. 22, 1995.

Error Processing in Separate Paths

Traditionally, the write and read paths of a multitracked disk storage drive have been failure-independent. In the write path, a symbol stream would be error encoded, then modulation encoded, and finally written out to the disk storage medium as a signal stream.

Upon playback, the signal stream would be processed in reverse order in a separate read path. In the read path, the signals would be demodulated into a stream of digital symbols and then error decoded. Significantly, the structure for processing the digital symbols to ascertain error was separate from the encoding structure in the write path. In addition, in the art before the Cox patent, the encoders and syndrome generators provided a constant number of correction symbols per codeword.

Error Correction Codeword Generation and the Write Path

Reed-Solomon codes (RS codes) are block-based error correcting codes with a wide range of applications in digital communications and storage. RS codes are a subset of BCH codes, and are linear block codes. An RS code is specified as RS(n,k) of n symbols/codeword, where n includes k data symbols and 2t concatenated redundancy symbols of s bits each. The RS code can correct up to t symbols in error in any given codeword (in this specification, the terms "symbol" and "byte" are used synonymously).

An RS encoder generally takes an original block of digital data, usually called the message word, and adds extra "redundant" bits, usually called a checksum word, to form a codeword to be transmitted or stored. The checksum word, in essence, mathematically describes the bit patterns of the message word. Errors may occur during transmission or storage. An RS decoder then processes each block of received data and attempts to correct any errors and recover the original message word.

For example, suppose an RS(255,223) code with eight bits/symbol were specified. Each codeword would contain 255 codeword bytes, of which 223 bytes would be original data (message word) and 32 bytes would be redundant or parity bytes (checksum word). For a symbol size of s bits/symbol, the maximum codeword length (number of bytes) n for an RS(n,k) code is $n=2^s-1$. If the number of bits per symbol s=8 bits/byte, then the maximum codeword length $n=2^s-1=2^8-1=256-1=255$ bytes. Thus, for this code n=255, k=32, s=8, and 2t=n-k=255-223=32, t=16 bytes of correction. That is, the code can correct up to 16 bytes in error anywhere in the codeword by using the included redundant information.

A linear code, such as an RS code, must conform to the rules of finite (or Galois) field arithmetic. This includes the closure property. That is, selected binary arithmetic operations such as addition, subtraction, multiplication, and division on field elements always produce a resultant member of or in the same field.

Error correction is the mathematical reconstitution of correct codewords. When discussing coding theory, it is common practice to treat message words, checksum words, and codewords as a number of symbols representing coefficients of a polynomial in a variable, such as "x". A codeword is generated using a special polynomial, the generator polynomial of the code. All valid codewords are exactly divisible by the generator polynomial, that is, there is a division remainder of zero. The general form of the generator polynomial is:

$$g(x)=(x-\alpha^i)(x-\alpha^{i+1})(x-\alpha^{i+2}) \ldots (x-\alpha^{i+2t})$$

where "$\alpha$" is a primitive element in the field.

The codeword may be constructed using:

$$c(x)=x^{n-k}m(x)+x^{n-k}m(x) \text{ modulo } g(x)$$

where the first term is represents the message word, and the second term represents the remainder of the message word when divided by the generator polynomial. Codewords are then sent to the disk drive via the write path for storage.

Error Detection/Syndrome Processing and the Read Path

A received codeword $r(x)=c(x)+e(x)$, where $c(x)$ is the codeword that was originally recorded or transmitted and $e(x)$ is the error. Relatedly, the "syndromes" of the received codeword are defined informally as:

$$S_i=r(x)|_{x=\alpha^i}=c(x)|_{x=\alpha^i}+e(x)|_{x=\alpha^i}=e(x)|_{x=\alpha^i}$$

where i=0 to 2t−1. Alternately, a non-zero beginning index may be used, for example, i=z+0 to z+2t−1 where z≠0. Thus, $r(x)=c(x)$ if and only if $g(x)$ divides into $r(x)$ with a remainder of zero, i.e., $S_i=0$ for all i. Otherwise, it can be shown that the syndromes are dependent only upon the errors $e(x)$. That is, if $e(x)=0$, then the syndromes for the counterpart received codeword are zero. However, if $e(x)\neq 0$, $S_i\neq 0$ for at least one value of i.

In the typical textbook Reed-Solomon code implementation, the encoder uses fixed value finite field multipliers with the values set equal to the coefficients of the generator polynomial, while the syndrome generator uses fixed value finite field multipliers with the values set equal to the roots of the generator polynomial. Both the encoding and syndrome generation can be implemented in relatively simple logic. The remainder of the decoding process (beyond syndrome generation) is not pertinent to this invention.

The Cox Patent

The aforementioned Cox '719 patent discloses a composite encoder and syndrome generator using a recursive logical filter structure having multiple multiplier stages and a switching arrangement. The composite generator uses a preselected set of tap weights for approximating either a generating polynomial for encoding, or parity check polynomial for syndrome computation. The switching arrangement may be used to vary the correction capability of the code by selectively including or excluding ones of said stages. The effect of the inclusion or exclusion of stages is to either increase or reduce the number of redundant 2t symbols. By using a single set of multiplier stages with constant values or weights formed from the roots $(x-\alpha^i)(x-$ $\alpha^{i+1}$) ... (x-$\alpha^{i+2t-1}$) of the generating polynomial g instead of the coefficients $g_i$, Cox found that the weights or values associated with a stage could remain the same for both encoding and syndrome generation. The embodiment also utilized the electronic enablement or disablement of feed-forward coupling among the stages.

Cox provides a single composite structure for use as an encoder when the feed-forward paths are enabled, and a syndrome generator when the paths are disabled. Also, the number of n−k=2t redundant or error correcting symbols per codeword can be changed electronically as, for example, different bands on disk tracks utilize a different number of correction symbols per stored codeword. While the advantages of the Cox invention are considerable, it still serially processes each symbol.

Interfaces and Variable Data Rates

In many digital systems, the processing bottleneck is the inability to move data quickly enough. An often-used solution to this problem is to make data paths wider. Unfortunately, existing ECC encoders and syndrome generators generally operate on a single symbol at a time.

An encoder that operates on multiple symbols at a time would have difficulties in situations where the number of symbols in a message word is not a multiple of the number of symbols operated upon at a time. A similar problem may be imposed by some interfaces (e.g. fibre channel) that may break a message word into multiple, varying size, packets.

An ECC encoder that can process more than one symbol at a time, or that can process a varying number of symbols per clock cycle, or both, is therefore needed.

SUMMARY OF THE INVENTION

It is accordingly an object of this invention to devise a composite encoder and syndrome generator for a linear block ECC system to process one or more symbols at a time for a generator-encoding polynomial of predetermined maximum power or degree.

It is a related object that the number of symbols subject to concurrent processing by said composite encoder/generator is dynamically alterable.

It is a related object that said composite encoder/generator facilitate linear block ECC coding in symbol processing for communications and storage subsystems.

The foregoing objects are believed satisfied by an algebraic error correction system having a multistage composite polynomial encoder/syndrome generator device and a logic arrangement for selectively enabling stages of the device. In this regard, the encoder generates check symbols over counterpart data symbol strings to form codewords that are written out to a write path. The syndrome generator derives syndromes from codewords copied in from a readback path indicative of their error state. Relatedly, each stage of the composite device is arranged in a predetermined order of significance. For Reed-Solomon codes, the order is the exponent of the polynomial used, but the present invention is not limited to Reed-Solomon codes.

Each stage of the composite device further comprises a recursive processing network responsive to q symbols for generating a partial resultant, and a feed-forward path for applying the partial resultant to the recursive network of an adjacent stage in order of significance. The logic arrangement of the device selectively enables the feed-forward paths for encoder operation and disables the paths for syndrome generator operation. The logic arrangement also applies q-tuples of symbols to counterpart stages of the composite device. The number of symbols contemplated is two or more at a time. At some interfaces to the composite device, such as those relating to fiber-optic transmission, a variable number of symbols may be presented. For that reason, one embodiment is dynamically adjustable to accommodate and process a different number of symbols per stage over different cycles.

Each recursive processing network includes up to q recursive processing paths. Likewise, each stage further includes circuits for adjusting the degree of process nesting according to the number of symbols concurrently being applied to the stage. Also, the stages of the composite device when operated as a syndrome generator effectively constitute a Horner's Rule polynomial evaluation of said q-tuples for a single value.

The objects are further satisfied by considering the invention as a method for adjusting the processing speed of an algebraic error correction system having a multistage composite polynomial encoder/syndrome generator device and a logic arrangement. The method includes configuring the device as an encoder or syndrome generator responsive to extrinsic commands and arranging the stages in any order, subject only to the limitation that the order of stages representing the selected polynomial roots as invoked in the encoding of the codeword be retained for the syndrome derivation. During each cycle of operation, and responsive to another extrinsic command, the method further includes recursively processing q symbols applied at each stage and deriving therefrom a partial resultant. In the event that the device is configured as an encoder, the method applies the partial resultant to an adjacent stage of the device in a prescribed or predetermined order. Lastly, as previously mentioned, responsive to other extrinsic signals, the method selectively varies the number of symbols in the q-tuples being applied to counterpart stages for any given cycle by effectively disabling or enabling the number of recursive processing paths.

DESCRIPTION OF THE PREFERRED EMBODIMENT

Figure 1:
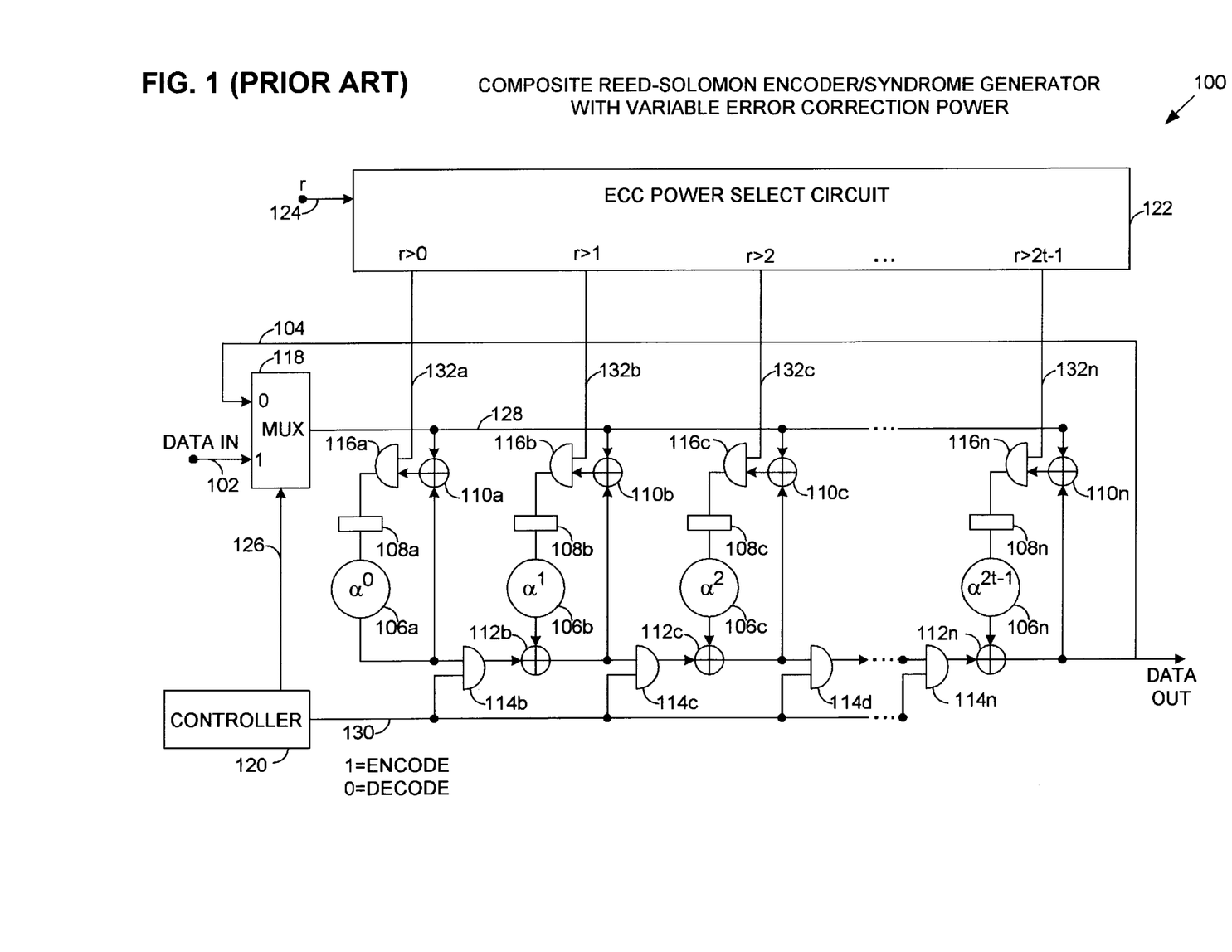
FIG. 1 depicts a composite Reed-Solomon RS (n,k) encoder/syndrome generator with adjustable error correction power according to the prior art.

Referring now to FIG. 1, there is shown a composite Reed-Solomon RS (n,k) encoder/syndrome generator with adjustable correction power according to the prior art as set out in the above-mentioned Cox patent. Circuit 100 generates check symbols that are appended to the uncorrupted input data supplied by way of bus 102, and transmitted by way of bus 104 to a channel subject to noise. The circuit also computes the error syndromes from the potentially noise-corrupted data.

Circuit 100 comprises a plurality of fixed multipliers 106a, 106b, 106c, ..., 106n, of values $\alpha^0, \alpha^1, \alpha^2, ..., \alpha^{2t-1}$, respectively, a plurality of registers 108a, 108b, 108c, . . . , 108n, a plurality of adders 110a, 110b, 110c, . . . , 110n, and a second plurality of adders 112a, 112b, 112c, . . . , 112n. Each multiplier 106, register 108, and associated adders 110 and 112 constitutes a multiplier unit M. Circuit 100 also includes a first set of AND gates 114a, 114b, . . . , 114n, and a second set of AND gates 116a, 116b, . . . , 116n. The circuit further includes a multiplexer (MUX) 118, a controller 120, and a programmable ECC power selection circuit 122.

If the circuit in FIG. 1 is set (via input 124) such that the number of redundant bytes r=2t, all control lines 132 including and to the left of 132n will be activated. Hence, all units with fixed multipliers will receive incoming data.

Operationally, controller 120 provides a signal on line 126 to condition MUX 118. MUX 118 places onto bus 128 either the data presented on line 102 or the data from bus 104. Controller 120 also provides a signal on line 130 to condition AND gates 114. Line 130 is brought to a logic one for encoding operations and a logic zero for decoding operations.

For encoding operations, the message word to be encoded is presented one symbol at a time on line 102. Controller 120 provides a logic one signal on line 126 to condition MUX 118 to pass the data from line 102 to bus 128. After the last symbol of the message word has been processed, controller 120 uses line 126 to condition MUX 118 to pass data from bus 104 to bus 128. During the next 2t clock cycles, the 2t check symbols are produced sequentially on bus 104.

Bus 128 provides the data concurrently to adders 110. Adders 110 provide data to AND gates 116 which pass the data or zero to registers 108. AND gates 116 are conditioned by ECC Power Select Circuit 122 through lines 132. For each multiplier unit M that has been enabled by ECC Power Select Circuit 122, intermediate values are stored into registers 108. For multiplier units that have been disabled by ECC Power Select Circuit 122, their registers 108 are loaded with zero every clock cycle. Data from register 108 is passed to multiplier 106 and the resulting product is passed to adder 112. Note that the very first multiplier unit M (unit "a") does not have an adder 112; it can be viewed as having an adder with one input permanently zero. The second input to adder 112 is the output of AND gate 114 (again multiplier unit "a" does not have an AND gate 114). Since controller 120 provides a logic one on line 130 for encode operations, the output of AND gate 114 is simply the sum from adder 112 of the previous stage in the predetermined order of stages. The sum from adder 112 is the second input to adder 110 and also is passed to AND gate 114 of the following stage in the predetermined order of stages.

For decoding, controller 120 conditions AND gates 114 with a logic zero signal on line 130 thus disabling the feed forward path through AND gates 114 and adders 112. Further, MUX 118 is conditioned by the signal on line 126 from controller 120 to pass the data to be decoded from bus 102. As during encoding, the data will be fed to the various multiplier units M to generate syndromes which are stored in the respective registers 108a, . . . , 108n. After the data to be decoded has been transmitted, the values held in registers 108 will be the syndromes of the received codeword. With selection circuit 122 conditioned by the selected value of r to deactivate all control lines 132 to the right of r>1, for example, only the multiplier units M to the left of and including r>1 will be activated. Thus, the value selected by the user for the variable r will determine the number of check bytes and error syndromes that are generated, and hence the preselected correction power desired from a maximum corresponding to 2t to a minimum of zero.

Figure 2:
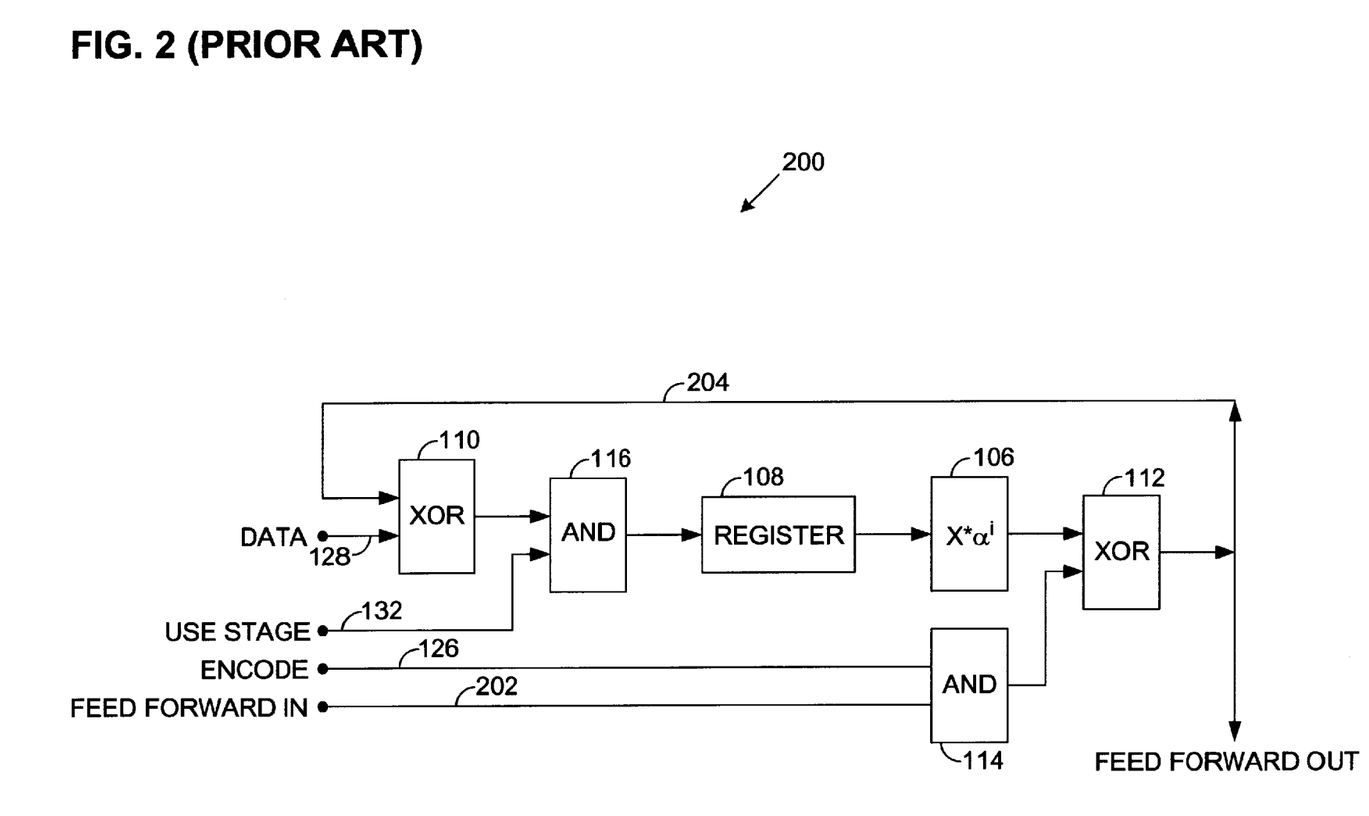
FIG. 2 shows an RS (n,k) encoder/syndrome generator stage of the prior art system depicted in FIG. 1.

Referring now to FIG. 2, there is shown a logical embodiment of an individual stage 200 of an algebraic polynomial encoder/syndrome generator as depicted in the Cox patent. In this prior art embodiment, the data symbol is applied on path 128 to XOR gate 110 as a first input. The second input is applied over path 204 to XOR 110. This second input is also the output from XOR gate 112. This stage can be selectively enabled or disabled by an extrinsic command or signal applied on path 132 to AND gate 116. That is, AND gate 116 is operative only so long as a logical one is applied to path 132. Another extrinsic command applied on path 126 is used to enable the feed-forward-in path 202 from an adjacent stage 200 of the predetermined order of stages 200 by conditioning AND gate 114. This enablement permits stages 200 coupled by feed-forward-in paths to operate collectively as an algebraic polynomial encoder. The data from feed-forward-in path 202 is logically summed with the output of multiplier 106, and the sum fed back into stage 200 via path 204. The output of the fixed value multiplier 106 is the contents of register 108 scaled by the value of the multiplier $\alpha^i$. Path 204 also acts as the feed-forward-out path coupled to the next stage 200 of the encoder.

Figure 3:
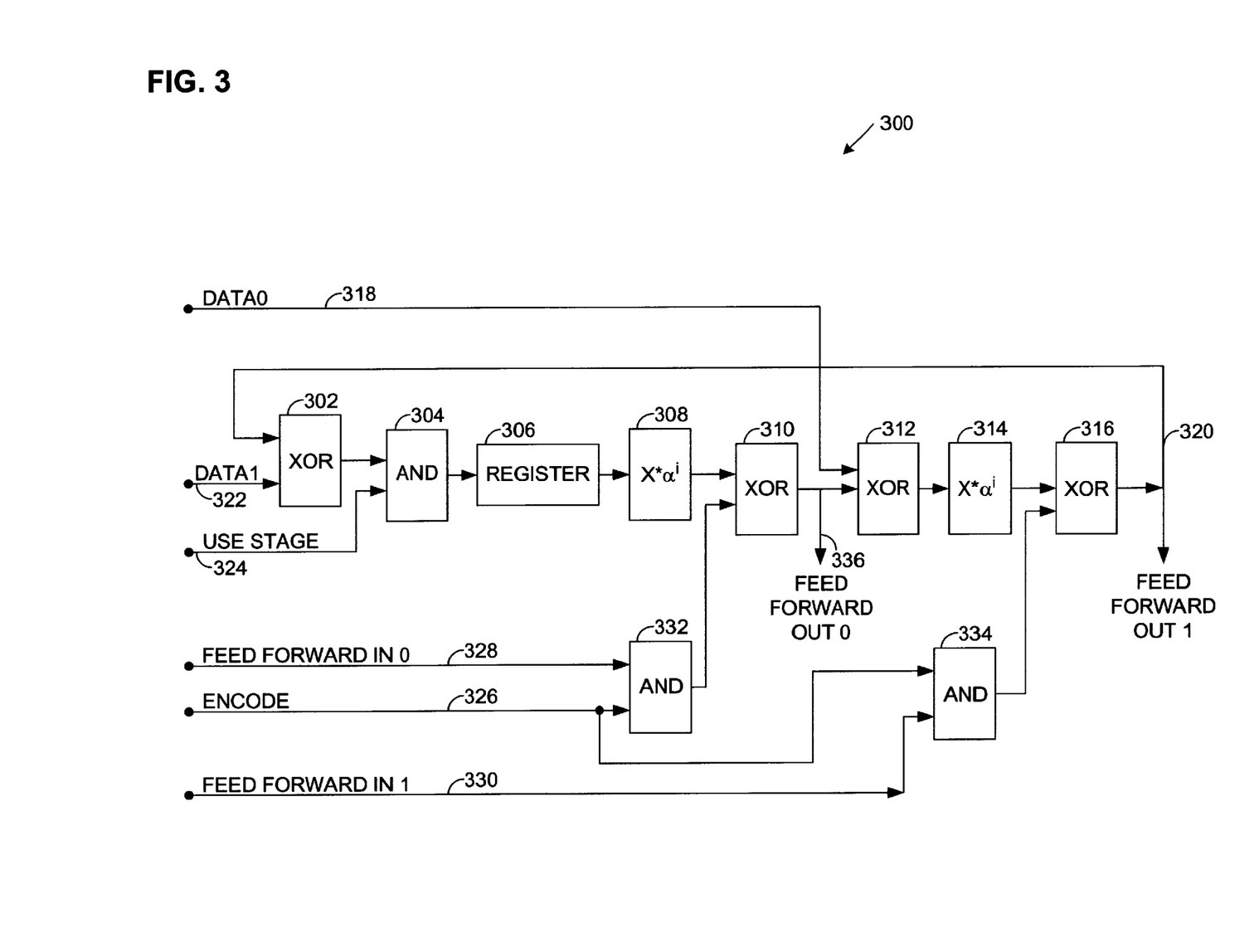
FIG. 3 sets out an RS (n,k) encoder/syndrome generator stage modified according to the invention in which a pair of symbols can be processed at a time.

Referring now to FIG. 3, there is shown an individual stage of an algebraic encoder/syndrome generator, modified according to the present invention to process a pair of symbols per clock cycle. A logical command signal applied to AND gate 304 via path 324 controls the use of modified stage 300. Activation of AND gate 304 enables the signal flow from input symbol path 322 (termed DATA1 here) through XOR 302 to register 306. Another logical command signal applied to AND gates 332 and 334 via path 326 controls the operation of stage 300 either as an encoder or as a syndrome generator. If AND gates 332 and 334 are enabled, then a feed-forward in DATA0 and a feed-forward in DATA1, representing a first and second symbol processing from a previous stage in the predetermined order of stages, are respectively coupled over paths 328 and 330 to XOR gates 310 and 316. The disablement of AND gates 332 and 334 through a suitable signal on path 326 implies that stage 300 is operating in the syndrome generation mode. When a pair of symbols from a codeword is applied respectively to paths 318 (termed DATA0 here) and 322, they each encounter processing in a recursive manner through multipliers 308 and 314, and XOR gates 302, 310, 312, and 316.

Figure 4:
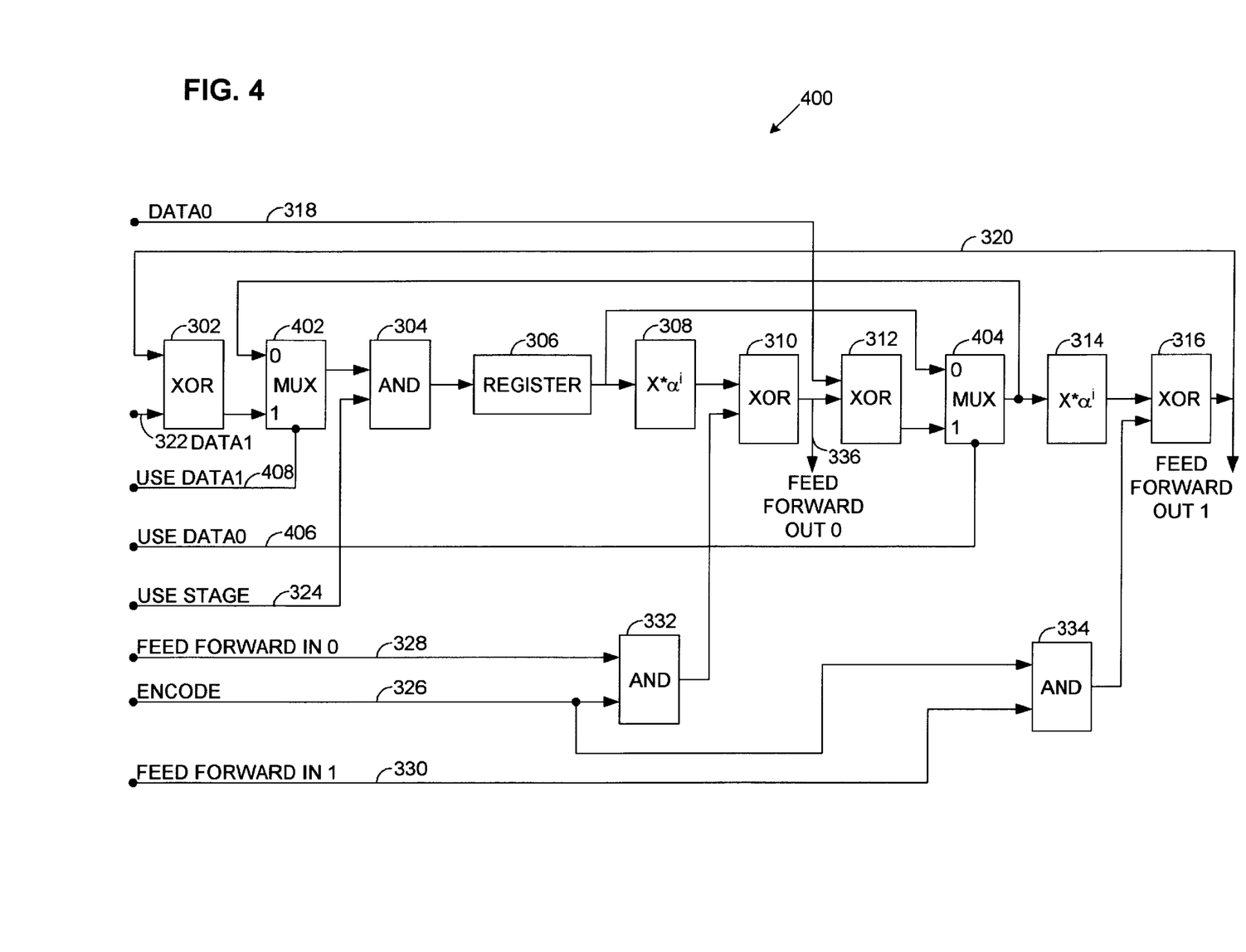
FIG. 4 illustrates an RS (n,k) encoder/syndrome generator stage modified according to the invention in which either a symbol or a pair of symbols can be selectively processed per cycle.

Referring now to FIG. 4, there is shown an encoder/syndrome generator stage 400 modified according to the present invention, in which either a symbol or a pair of symbols can be processed per clock cycle. The structural difference of the variable symbol processing of FIG. 4 versus the fixed symbol processing of FIG. 3 is essentially the use of a pair of MUXs 402 and 404, and their attendant circuit connections. An extrinsic command applied to path 324 disables AND gate 304. This has the effect of disabling the entire stage 400. Inputs DATA0 318 and DATA1 322 each have enabling lines (406 and 408, respectively), so that either one or two symbols may be processed per clock cycle. In other words, when processing two symbols at a time, MUX 402 and MUX 404 each select their respective bottom inputs. When operating on only one data symbol at a time, the input data may be presented on either DATA0 318 or on DATA1 322; if input data is only on DATA0 318, then MUX 402 selects its top input and MUX 404 selects its bottom input; if input data is only on DATA1 322, then MUX 402 selects its bottom input and MUX 404 selects its top input. It should be noted that the location of the data to be processed may change on a cycle by cycle basis.

For example, suppose the input data stream is A B C D, and the fixed multiplier is α because i=1, and the circuit is set to perform the decoding operation. The following three tables describe input data and register contents in several different cases. In case 1, data is taken two symbols at a time as shown below (X means "don't care"):

TABLE 1

| Time | DATA0 | DATA1 | Register |
|------|-------|-------|----------|
| 0 | X | X | 0 |
| 1 | A | B | $A\alpha + B$ |
| 2 | C | D | $(A\alpha^2 + B\alpha + C)\alpha + D = A\alpha^3 + B\alpha^2 + C\alpha + D$ |

In case 2, data is taken one symbol at a time on DATA0:

TABLE 2

| Time | DATA0 | DATA1 | Register |
|------|-------|-------|----------|
| 0 | X | X | 0 |
| 1 | A | X | A |
| 2 | B | X | $A\alpha + B$ |
| 3 | C | X | $A\alpha + B\alpha + C$ |
| 4 | D | X | $A\alpha^3 + B\alpha^2 + C\alpha + D$ |

In case 3, data is taken one symbol at a time on DATA1:

TABLE 3

| Time | DATA0 | DATA1 | Register |
|------|-------|-------|----------|
| 0 | X | X | 0 |
| 1 | X | A | A |
| 2 | X | B | $A\alpha + B$ |
| 3 | X | C | $A\alpha^2 + B\alpha + C$ |
| 4 | X | D | $A\alpha^3 + B\alpha^2 + C\alpha + D$ |

Figure 5:
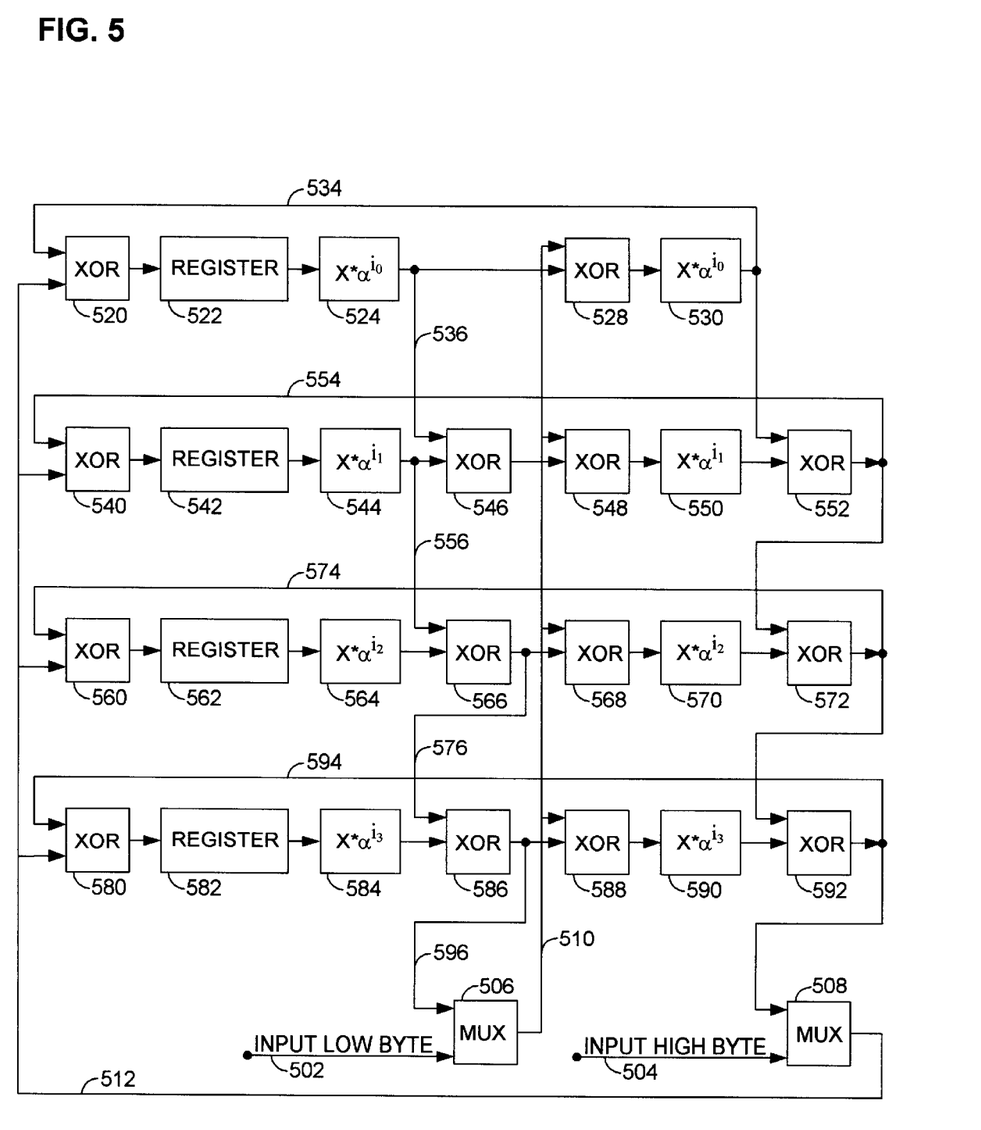
FIG. 5 depicts several stages of an encoder/syndrome generator as modified according to the invention.

Referring now to FIG. 5, there is shown a logic block diagram of several stages of an encoder/syndrome generator of FIG. 3 with each stage modified according to the present invention to process a pair of symbols at a time per stage for each cycle of operation. In this regard, each pair of symbols is respectively denominated as "input low byte" applied on path 502 and as "input high byte" applied on path 504. These bytes are respectively multiplexed through MUXs 506 and 508 onto respective paths 510 and 512. The input low byte is then applied to each first recursion path for each stage, namely, at XOR gates 528, 548, 568, and 588. The input high byte is applied to each second recursion path for each stage, namely, at XOR gates 520, 540, 560, and 580.

Referring again to FIG. 3, and taken together with FIG. 5, it is apparent that the composite device is responsive to two symbols of data at a time when operating as an encoder, or two symbols at a time of a codeword when operating as a syndrome generator. These two symbols are then respectively applied to counterpart processing paths in each of the stages.

When the composite device is operated as a syndrome generator, it provides an implementation of Homer's Rule. Homer's Rule is an efficient evaluation of polynomials employing solely the arithmetical operations of addition and multiplication on the basis of recurrence-oriented rearrangement. Thus, a polynomial of the form:

$$p(x) = a_n x^n + a_{n-1} x^{n-1} + a_{n-2} x^{n-2} + \ldots + a_1 x + a_0$$

can be evaluated as:

$$p(x) = ((\ldots(a_n x + a_{n-1})x + a_{n-2})x + \ldots + a_1)x + a_0$$

Suppose, for purposes of illustration, that the composite encoder/syndrome generator comprised two stages, each stage being of the type illustrated in FIG. 2. Further, suppose that the first and second multiplier values for the first stage were $\alpha^0 = 1$ while the first and second multiplier values for the second stage were $\alpha^1 = \alpha$. Let it be assumed that an input data symbol stream consists of four symbols A, B, C, and D. It is desired to compute and append two check bytes E and F thereto to form an RS codeword. In a second case, it is desired to compute a syndrome from an RS codeword ABCDEF as applied to the device as a syndrome generator.

When the data symbol stream ABCD is applied to a 2-stage composite device as disclosed in the prior art Cox patent for encoding purposes, it produces a codeword ABCDEF in six clock cycles. Significantly, the encoding operation produces the two check bytes E and F. The syndrome generation operation uses bytes E and F to determine the error state over the codeword ABCDEF.

Referring now to the following Tables 4 and 5, there are depicted multicycle encoding and syndrome generation operations, respectively, for a prior art device. The state of the stage 0 and stage 1 registers is indicative of the progress of the computation during any particular clock cycle.

TABLE 4

Multiple Cycle RS (n,k) Encode Operation of Prior Art Composite Device

| Time | Data | Stage 0 Register | Stage 1 Register |
|------|------|------------------|------------------|
| 0 | A | A | A |
| 1 | B | $A + B$ | $A(\alpha\ 1) + B$ |
| 2 | C | $A + B + C$ | $A(\alpha^2 + \alpha + 1) + B(\alpha + 1) + C$ |
| 3 | D | $A + B + C + D$ | $A(\alpha^3 + \alpha^2 + \alpha + 1) + B(\alpha^2 + \alpha + 1) + C(\alpha + 1) + D$ |
| 4 | X | $A(\alpha^4 + \alpha^3 + \alpha^2 + \alpha) + B(\alpha^3 + \alpha^2 + \alpha) + C(\alpha^2 + \alpha) + D\alpha$ | 0 |
| 5 | X | 0 | 0 |

$E = A(\alpha^4 + \alpha^3 + \alpha^2 + \alpha + 1) + B(\alpha^3 + \alpha^2 + \alpha + 1) + C(\alpha^2 + \alpha + 1) + D(\alpha + 1)$
$F = A(\alpha^4 + \alpha^3 + \alpha^2 + \alpha) + B(\alpha^3 + \alpha^2 + \alpha) + C(\alpha^2 + \alpha) + D\alpha$ Table 4 shows a single symbol at a time encoding in a 2-stage encoder. The check byte E is being produced on path 320 of the encoder stage in FIG. 2 at time =4, is also used as the data input to stage 0 and stage 1. Relatedly, the check byte F is actually being generated at time=5 and is used as the data input to stage 0 and stage 1.

TABLE 5

Multiple Cycle RS (n,k) Syndrome Generation Operation of Prior Art Composite Device

| Time | Data | Stage 0 Register | Stage 1 Register |
|------|------|------------------|------------------|
| 0 | A | A | A |
| 1 | B | $A + B$ | $A\alpha + B$ |
| 2 | C | $A + B + C$ | $A\alpha^2 + B\alpha + C$ |
| 3 | D | $A + B + C + D$ | $A\alpha^3 + B\alpha^2 + C\alpha + D$ |
| 4 | E | $A(\alpha^4 + \alpha^3 + \alpha^2 + \alpha) + B(\alpha^3 + \alpha^2 + \alpha) + C(\alpha^2 + a) + D\alpha$ | $A(\alpha^3 + \alpha^2 + \alpha + 1) + B(\alpha^2 + \alpha + 1) + C(\alpha + 1) + D$ |
| 5 | F | 0 | 0 |

Table 5 depicts a single symbol at a time syndrome generation in a 2-stage syndrome generator. The RS codeword ABCDEF is run through the generator starting at time=0.

Referring now to FIG. 3 and Table 6, it is shown that check bytes E and F are generated in significantly fewer cycles where the composite device is modified according to the present invention, rather than arranged as in the prior art Cox patent.

TABLE 6

Reduced Multiple Cycle RS (n,k) Encode Operation According to FIGS. 3 and 5

| Time | Data_0 | Data_1 | Stage 0 Register | Stage 1 Register |
|------|--------|--------|------------------|------------------|
| 0 | A | B | A + B | A($\alpha$ + 1) + B |
| 1 | C | D | A + B + C + D | A($\alpha^3$ +$\alpha^2$ + $\alpha$ + 1) + B($\alpha^2$ + $\alpha$ 1) + C($\alpha$ + 1) + D |
| 2 | X | X | 0 | 0 |

E = A($\alpha^4$ + $\alpha^3$ + $\alpha^2$ + $\alpha$ + 1) + B($\alpha^3$ + $\alpha^2$ + $\alpha$ + 1) + C($\alpha^2$ + $\alpha$ + 1) + D($\alpha$ + 1)
F = A($\alpha^4$ + $\alpha^3$ + $\alpha^2$ + $\alpha$) + B($\alpha^3$ +$\alpha^2$ + $\alpha$) + C($\alpha^2$ + $\alpha$) + D$\alpha$ It should be noted that feed forward out 0 on path 336 is switched to DATA0 line 318 during the third clock cycle where time t=2. Concurrently, feed forward out 1 on path 320 is switched to DATA1 on path 322.

Syndrome generation using the present invention, as depicted in Table 7, also exhibits a similar reduced cycle effect:

TABLE 7

Reduced Multiple Cycle RS (n,k) Syndrome Oeneration Operation According to FIGS. 3 and 5

| Time | Data_0 | Data_1 | Stage 0 Register | Stage 1 Register |
|------|--------|--------|------------------|------------------|
| 0 | A | B | A + B | A$\alpha$ + B |
| 1 | C | D | A + B + C + D | A$\alpha^3$ + B$\alpha^2$ + C$\alpha$ + D |
| 2 | B | F | 0 | 0 |

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

We claim:

1. An algebraic coding system comprising:
   (a) a multistage composite polynomial encoder/syndrome generator device for generating check symbols over counterpart data symbol strings to form codewords and for deriving syndromes from codewords indicative of their error state, each stage of said composite device representing a polynomial root factor and being arranged in a predetermined order, each stage comprising:
      (1) a recursive processing network responsive to q symbols for generating a partial resultant; and
      (2) a feed-forward path for applying the partial resultant to the recursive network of an adjacent stage in the predetermined order; and
   (b) a logic arrangement for selectively enabling said feed-forward paths for encoder operation and disabling said paths for syndrome generator operation and for applying q-tuples of symbols to counterpart stages of the composite device.

2. The algebraic coding system of claim 1, wherein each recursive processing network includes up to q degrees of process nesting, each stage further comprising circuits for adjusting the degree of process nesting according to the number of symbols concurrently being applied to the stage.

3. The algebraic coding system of claim 1, wherein said logic arrangement includes circuits responsive to external signal indication for disabling said feed-forward paths, and further wherein the stages of said composite device upon disablement of said feed-forward paths and responsive to the application of q-tuples of codeword symbols to counterpart stages include circuits for causing a Homer's Rule polynomial evaluation of said q-tuples for a single value.

4. The algebraic coding system of claim 1, wherein each recursive processing network comprises at least a first and a second symbol processing path, each processing path including a fixed value polynomial multiplier, each path having at least a single input and a single output, the output from the second path being applied as an input to the first path and the output of the first path being applied as an input to the second path, the inputs to said first path further including a first symbol, the inputs to said second path further including a second symbol, said first path still further including a path disablement gate responsive to an external signal, said second path still further including a feed-forward enablement circuit for applying as an input to the second path a partial resultant output from an adjacent stage in the predetermined order.

5. An algebraic coding system comprising a cyclically operable, multistage, composite polynomial encoder/syndrome generator device for generating check symbols over counterpart data symbol strings to form codewords and for deriving syndromes from codewords indicative of their error state, and an arrangement for selectively applying data symbol strings to the composite device when enabled as an encoder and for applying codewords to the composite device when enabled as a syndrome generator, wherein:

each stage of said composite device represents a polynomial root factor and includes a recursive processing network of degree q responsive to q symbols for generating a partial resultant, and a feed-forward path for applying the partial resultant to the recursive network of an adjacent stage in a predetermined order; and said logic arrangement includes first circuits responsive to extrinsic signals for selectively enabling said feed-forward paths for encoder operation and disabling said paths for syndrome generator operation, second circuits for applying q-tuples of symbols to the counterpart stages of the composite device, and third circuits responsive to other extrinsic signals for selectively varying the number of symbols in the q-tuples being applied to the counterpart stages for any given cycle.

6. The algebraic coding system of claim 5, wherein the stages of said composite device upon disablement of said feed-forward paths and responsive to application of q-tuples of codeword symbols to counterpart stages include circuits for causing a Homer's Rule polynomial evaluation of said q-tuples for a single value.

7. A method for adjusting the processing of an algebraic coding system comprising a cyclically operable, multistage, composite polynomial encoder/syndrome generator device for generating check symbols over counterpart data symbol strings to form codewords and for deriving syndromes from codewords indicative of their error state, and an arrangement for selectively applying symbols from data strings to the composite device when enabled as an encoder and for applying symbols from codewords to the composite device when enabled as a syndrome generator, the method comprising the steps of:
   (a) configuring the device as an encoder or syndrome generator responsive to an extrinsic command of a first kind, each stage of said composite device representing a polynomial root factor, and arranging ones of the stages in a predetermined order;
   (b) during each cycle of operation and responsive to an extrinsic command of a second kind, recursively processing q symbols as applied at each stage and deriving therefrom a partial resultant;

(c) in the event that the device is configured as an encoder, applying the partial resultant to an adjacent stage of the device in the predetermined order, otherwise aggregating said partial resultant as a syndrome; and (d) for any given cycle and responsive to an extrinsic command of the second kind, selectively varying the number of symbols in the q-tuples being applied to the counterpart stages.

8. A computer program product comprising a machine-readable memory having stored therein a plurality of processor executable control program steps for adjusting the processing of an algebraic coding system comprising a cyclically operable, multistage, composite polynomial encoder/syndrome generator device for generating check symbols over counterpart data symbol strings to form codewords and for deriving syndromes from codewords indicative of their error state, and an arrangement for selectively applying data symbol strings to the composite device when enabled as an encoder and for applying codewords to the composite device when enabled as a syndrome generator, said control program steps including:

(a) configuring the device as an encoder or syndrome generator responsive to an extrinsic command of a first kind, each stage of said composite device representing a polynomial root factor, and arranging the stages in a predetermined order;

(b) recursively processing q symbols as applied at each stage and deriving therefrom a partial resultant during each cycle of operation and responsive to an extrinsic command of a second kind;

(c) applying the partial resultant to an adjacent stage of the device in the predetermined order in the event that the device is configured as an encoder; and (d) selectively varying the number of symbols in the q-tuples being applied to the counterpart stages for any given cycle responsive to an extrinsic command of the second kind.

9. An algebraic coding system comprising:

means for computing check symbols over counterpart data symbol strings to form codewords;

means for deriving syndromes from codewords indicative of their error state;

means for selecting the depth of error correction to be applied by engaging a variable number of processing stages;

means for choosing between encoding and decoding system operations;

means for processing a varying number of symbols per clock cycle; and means for dynamically altering the number of symbols concurrently processed by the system.

* * * * *